(12) United States Patent
Vaccariello

(10) Patent No.: US 10,673,447 B2
(45) Date of Patent: Jun. 2, 2020

(54) DEVICE AND METHOD FOR ANALOG-TO-DIGITAL CONVERSION WITH CHARGE REDISTRIBUTION, CONVERTER AND ASSOCIATED IMAGE ACQUISITION CHAIN

(71) Applicant: STMicroelectronics (Alps) SAS, Grenoble (FR)

(72) Inventor: Laurent Vaccariello, Fontanil-Cornillon (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 0 days.

(21) Appl. No.: 16/269,303

(22) Filed: Feb. 6, 2019

(65) Prior Publication Data

US 2019/0260382 A1 Aug. 22, 2019

(30) Foreign Application Priority Data

Feb. 20, 2018 (FR) ..................... 18 51446

(51) Int. Cl.
*H03M 1/66* (2006.01)
*H03M 1/00* (2006.01)
*H03M 1/46* (2006.01)
*H03M 1/06* (2006.01)
*H03M 1/80* (2006.01)
*H03M 1/12* (2006.01)
*H03M 1/36* (2006.01)

(52) U.S. Cl.
CPC ......... *H03M 1/002* (2013.01); *H03M 1/0629* (2013.01); *H03M 1/468* (2013.01); *H03M 1/00* (2013.01); *H03M 1/12* (2013.01); *H03M 1/365* (2013.01); *H03M 1/804* (2013.01)

(58) Field of Classification Search
CPC .......... H03M 1/00; H03M 1/12; H03M 1/365; H03M 1/804
USPC ......................... 341/150, 155, 110, 159, 172
See application file for complete search history.

(56) References Cited

U.S. PATENT DOCUMENTS

2010/0194619 A1* 8/2010 Ohnhaeuser .......... H03M 1/002
341/159
2012/0025062 A1* 2/2012 Neubauer ............. H03M 1/145
250/208.1

OTHER PUBLICATIONS

Konstantinidis, Anastasios et al., "Design Considerations for Switched-Capacitor Analog Memories," IEEE Nuclear Science Symposium and Medical Imaging Conference, Nov. 2-9, 1991, pp. 606-610.
Kuo, Chien-Hung et al., "A High Energy-Efficiency SAR ADC Based on Partial Floating Capacitor Switching Technique," IEEE Proceedings of the ESSCIRC, Sep. 12-16, 2011, pp. 475-478.

(Continued)

*Primary Examiner* — Joseph J Lauture
(74) *Attorney, Agent, or Firm* — Slater Matsil, LLP

(57) ABSTRACT

An N-bit type charge redistribution analog-to-digital conversion device includes an input terminal configured to receive an input signal and coupled via a line to an output terminal. The output terminal is configured to be coupled to a comparator. The device further includes three reference potential sources of different values and a network of capacitors, where a first terminal of each capacitor is coupled to the line, and where a second terminal of each capacitor is coupled to switching circuit configured for coupling the second terminal of each capacitor to one of the reference potentials.

20 Claims, 7 Drawing Sheets

(56) References Cited

OTHER PUBLICATIONS

Lin, David T., et al., "A Flexible 500 MHz to 3.6 GHz Wireless Receiver with Configurable DT FIR and IIR Filter Embedded in a 7b 21 MS/s SAR ADC," IEEE Transactions on Circuits and Systems—I: Regular Papers, vol. 59, No. 12, Dec. 2012, pp. 2846-2857.

Nayak, Neeraj et al., "A Comparison of Transient Digitization Methods for High Speed Analog Signals," IEEE International Symposium on Circuits and Systems (Cat. No. 01CH37196), May 6-9, 2001, pp. I-595-I-598.

\* cited by examiner

DEVICE AND METHOD FOR ANALOG-TO-DIGITAL CONVERSION WITH CHARGE REDISTRIBUTION, CONVERTER AND ASSOCIATED IMAGE ACQUISITION CHAIN

CROSS-REFERENCE TO RELATED APPLICATIONS

This application claims priority to French Patent Application No. 1851446, filed on Feb. 20, 2018, which application is hereby incorporated herein by reference.

TECHNICAL FIELD

This disclosure relates generally to analog-to-digital converters, and in particular embodiments to a device and method for analog-to-digital conversion with charge distribution and a converter and an associated image acquisition chain.

BACKGROUND

Charge redistribution converters include capacitors which are charged in a first sampling step. Then in a second digitization step, the electrical charges are transferred from one capacitor to another. The second digitization step is therefore a charge redistribution step.

The disclosure applies advantageously but not restrictively to image acquisition chains.

A digital camera includes an image acquisition chain notably including a pixel matrix e.g. of dimension n×m having n pixels aligned on the same line, and m lines being superimposed on each other, m and n being non-zero whole numbers.

FIG. 1 represents an example of an image acquisition chain of a pixel CH according to the prior art. Each pixel incorporated in the pixel matrix of dimension n×m is included in an image acquisition chain, in other words there are as many acquisition chains as columns in the pixel matrix, e.g. here there are m acquisition chains.

The chain CH includes a pixel 1 and a charge redistribution analog-to-digital converter 2.

An output S1 of the pixel 1 is connected to an input E2 of the converter 2.

The pixel 1 includes a photodiode, switching transistors and bias transistors. The photodiode generates at its output S1 two successive signals, the difference of which is proportional to the captured light intensity.

The two signals are successively converted by the device 2 into two distinct digital words.

In what follows, only the processing of a first analog signal s1 emitted by the pixel 1 is described in detail, the processing of a second signal emitted by the pixel 1 by the device 2 being identical to the processing of the first signal s1.

The analog signal s1 is converted by the device 2 into a digital word s2.

FIG. 2 represents an example of a charge redistribution analog-to-digital converter 2 of the 4-bit type according to the prior art.

The converter 2 includes a sampler 4, a four-bit type charge redistribution analog-to-digital conversion device 5, a comparator COMP and a state machine 3.

The sampler 4 includes an input E4 connected to the input E2, an output S4 connected to an input E5 of the device 5 and a control input Ec4 connected to an output S3 of the state machine 3.

The device 5 includes three connection terminals connected to three reference potential sources of different values of value Vref1, Vref2 and Vref3 connected to the connection terminals $E5_{REF1}$, $E5_{REF2}$ and $E5_{REF3}$, respectively, and an output S5 connected to a non-inverting input $E_{COMP1}$ of the comparator COMP.

The device 5 further includes four control inputs E51, E52, E53 and E54, connected to four outputs S31, S32, S33 and S34 respectively of the state machine 3.

The comparator COMP further includes an inverting input $E_{COMP2}$ connected here to the potential source Vref4 and an output S connected to an input E3 of the state machine 3.

The state machine 3 includes an input $E_{CLK}$ connected to a clock CLK and four outputs S3a, S3b, S3c and S3d connected to the output interface S2. Each output S3a, S3b, S3c and S3d delivers a bit a, b, c and d, respectively.

The state machine 3 further includes a programmable processing unit UT. The programmable processing unit UT may be implemented by a processor (e.g. a microprocessor) known in the art.

FIG. 3 represents an example of a four-bit type device 5 according to the prior art.

The device 5 includes a line L connecting the input E5 to the output S5 and five capacitors C1, C2, C3, C4 and C5.

The capacitor C5 has a capacitance C0. The capacitors C1, C2, C3 and C4 have, for example, capacitances equal to 8 times C0, 4 times C0, 2 times C0 and C0 respectively.

A first terminal $E_{1C1}$, $E_{1C2}$, $E_{1C3}$, $E_{1C4}$ and $E_{1C5}$ of each of the capacitors C1, C2, C3, C4 and C5 respectively is connected to the line L.

A second terminal $E_{2C1}$, $E_{2C2}$, $E_{2C3}$ and $E_{2C4}$ of each of the capacitors C1, C2, C3 and C4, respectively, is connected to an input $E_{MC1}$, $E_{MC2}$, $E_{MC3}$, $E_{MC4}$, respectively, of switching circuits referenced MC1, MC2, MC3 and MC4 respectively.

A second terminal $E_{2C5}$ of the capacitor C5 is connected to the input $E5_{REF3}$.

The switching circuits MC1, MC2, MC3 and MC4 each includes a control input EE51, EE52, EE53 and EE54 respectively connected to the input E51, E52, E53 and E54, respectively.

The switching circuits MC1, MC2, MC3 and MC4 respectively include: an input E1REF1, E2REF1, E3REF1 and E4REF1 respectively connected to the input $E5_{REF1}$; an input E1REF2, E2REF2, E3REF2 and E4REF2 respectively connected to the input $E5_{REF2}$; and an input E1REF3, E2REF3, E3REF3 and E4REF3 respectively connected to the input $E5_{REF3}$.

The switching circuits MC1, MC2, MC3 and MC4 are configured for connecting the input EMC1, EMC2, EMC3, EMC4 respectively to one of the inputs $E5_{REF1}$, $E5_{REF2}$ or $E5_{REF3}$ according to the control signal applied to the control input.

The programmable processing unit UT is configured for driving the sampler 4. The state machine 3 drives the switching circuits MC1, MC2, MC3 and MC4 according to the signal SCOMP delivered at the output S of the comparator COMP and according to the clock signal SCLK received at the input $E_{CLK}$.

The programmable processing unit UT is further configured for transmitting a four-bit digital word to the output interface S2.

The potentials Vref1 and Vref2 are, for example, of the same value equal to the maximum value of the signal s1 and of opposite signs, and the potential Vref3 is connected to an earth. In this case the potential Vref4 is connected to the earth.

In operation, a signal s1 is generated, for example, by the pixel 1 and is transmitted to the input E2.

FIG. 4 depicts an example of signals s1 and sp according to time.

The signal s1 includes the noise generated notably by the switching of the transistors incorporated in the pixel.

The signal sp of amplitude Ap is a representation of the signal s1 not including any noise.

The sampler 4 operates at a sampling frequency Fe of period Te.

In a first step, the sampler 4 records a value $A_1$ of the signal s1 at an instant t1. This voltage value is transmitted to the input E5 of the device 5.

The circuits MC1 to MC4 are driven so that the second terminal of capacitors C1 To C4 is coupled to the input $E5_{REF3}$.

The capacitors C1 to C5 are now charged.

In a second step, the sampler 4 is "off", i.e. no signal is transmitted to the input of the device 5.

In a third step, the device 5 implements a dichotomy algorithm known to the person skilled in the art.

A dichotomy is applied on the interval [−Vref; Vref] in which the value of the signal s1 recorded by the sampler 4 is situated.

At the end of this step, the processing unit UT determines the digital word corresponding to the value of the signal s1 recorded by the sampler 4 and delivers the four-bit digital word.

The digital word is transmitted to the output interface S2 including four outputs a, b, c and d.

The output a corresponds to the bit known to the person skilled in the art as the "Most Significant Bit" MSB and the output d corresponds here to the bit known to the person skilled in the art as the "Least Significant Bit" LSB.

However, the signal s1 at instant t1 has an amplitude $A_1$ different from the amplitude $A_p$ of the signal sp, i.e. of the non-noisy signal emitted by the pixel 1.

The resolution of the device 5 is such that the amplitude $A_1$ is included in a quantum interval [C2; C3] corresponding here to the binary word 0110 while the amplitude $A_p$ is included in a quantum interval [C3; C4] corresponding here to the digital word 0111.

Then the preceding steps are repeated at instant t2 corresponding to the duration t1 plus Te. The amplitude at instant t2 of the signal s1 is equal to A2. It is noted that at this instant the digital word generated by the device 5 is 1000.

At each sampling instant, a single value of the signal s1 is recorded. As the signal s1 fluctuates randomly, the digital value representing the color associated with the pixel 1s dependent on the noise.

In the reproduction of the image, the quality of the latter will be degraded.

One solution consists in modifying the resolution of the device 5 so that the device 5 is insensitive to noise by expanding the intervals [C2; C3] and [C3; C4]. However, the resolution of the device 5 is degraded, and consequently the definition of the reproduced image is coarse.

There is a need for a charge redistribution analog-to-digital converter less sensitive to the noise borne by the analog signal to be converted, the architecture of which is similar to a charge redistribution analog-to-digital converter known to the prior art.

SUMMARY

According to implementations and embodiments, provision is advantageously made at each sampling instant to record a plurality of values of the signal to be digitized and to average these values so as to filter the signal s1.

According to one aspect, an N-bit type charge redistribution analog-to-digital conversion device is provided including an input terminal intended to receive an input signal coupled via a line to an output terminal intended to be coupled to a comparator, three reference potential sources of different values, a network of capacitors where a first terminal of each capacitor is coupled to the line and a second terminal is coupled to a switching circuit configured for coupling the second terminal to one of the reference potentials or to leave the terminal floating.

Thus provision is notably made for switching circuit configured for leaving the second terminal of the capacitors floating.

According to one embodiment, the network of capacitors includes a reference capacitor of a capacitance equal to a reference capacitance and N groups of capacitors, the overall capacitance of each group following a geometric progression series of ratio $$\frac{2^N}{2^n}, 1 \leq n \leq N$$

and of an initial value equal to the reference capacitance, the capacitors of each group having a capacitance which is a multiple of the reference capacitance, the overall capacitance of the network of capacitors being equal to 2N times the reference capacitance.

According to another embodiment, the network of capacitors includes four groups of capacitors, a first group of capacitors including four capacitors of a capacitance equal to twice the reference capacitance, a second group including two capacitors of a capacitance equal to twice the reference capacitance, a third group including one capacitor of a capacitance equal to twice the reference capacitance and a fourth group including one capacitor of a capacitance equal to the reference capacitance.

A 4-bit type conversion device is obtained making it possible to convert an average of one to a maximum of eight samples.

Advantageously the three reference potential sources of different values include a first and a second sources of the same value and of opposite sign, and a third source coupled to an earth.

According to another aspect, an analog-to-digital converter is provided including a conversion device such as that previously defined, a comparator and a state machine configured for successively connecting the second terminal of the capacitors to the floating terminal, the output terminal of the conversion device being coupled to a non-inverting input of the comparator, an inverting input of the comparator being coupled to a variable potential and an output of the comparator being coupled to an input of the state machine, the state machine including an output for delivering a digital word, and the switching circuit each including an input coupled to an output of the state machine.

In other words, the converter averages a plurality of values of the signal to be digitized, and optionally weights the average.

According to yet another aspect, an image acquisition chain is provided including a conversion device such as that previously defined, the input terminal being coupled to the output of a pixel.

According to another aspect, an N-bit type charge redistribution analog-to-digital conversion method is provided including an input terminal intended to receive an input signal coupled via a line to an output terminal intended to be coupled to a comparator, three reference potential sources of different values, a network of capacitors whereof a first terminal of each capacitor is coupled to the line and a second terminal of each capacitor is coupled to the same reference potential, in which when the capacitors are charged by the input signal, the second terminal of at least one capacitor is disconnected from the earth for leaving the second terminal floating, and after a predetermined duration the disconnection operation is repeated until the second terminal of all the capacitors is floating.

Advantageously, the second terminal of capacitors is disconnected after the predetermined duration so that the overall switched capacitance is constant.

BRIEF DESCRIPTION OF THE DRAWINGS

Other advantages and features of the invention will appear on examination of the detailed description of embodiments, in no way restrictive, and the appended drawings in which.

DETAILED DESCRIPTION OF ILLUSTRATIVE EMBODIMENTS

Figure 1:
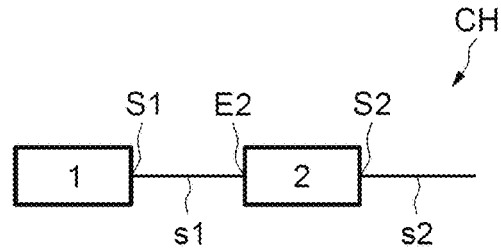
FIGS. 1 to 4, previously described, illustrate an image acquisition chain including a charge redistribution analog-to-digital conversion device according to the prior art.
Figure 2:
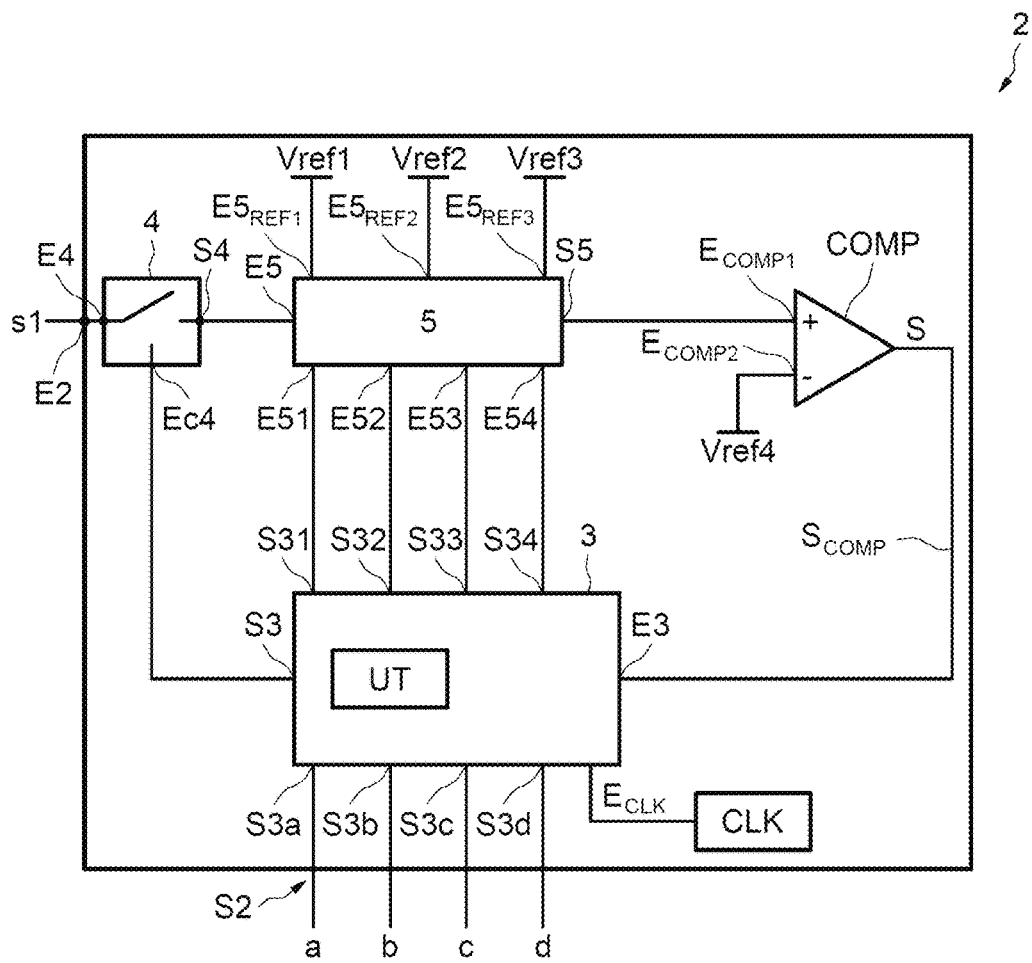
Figure 3:
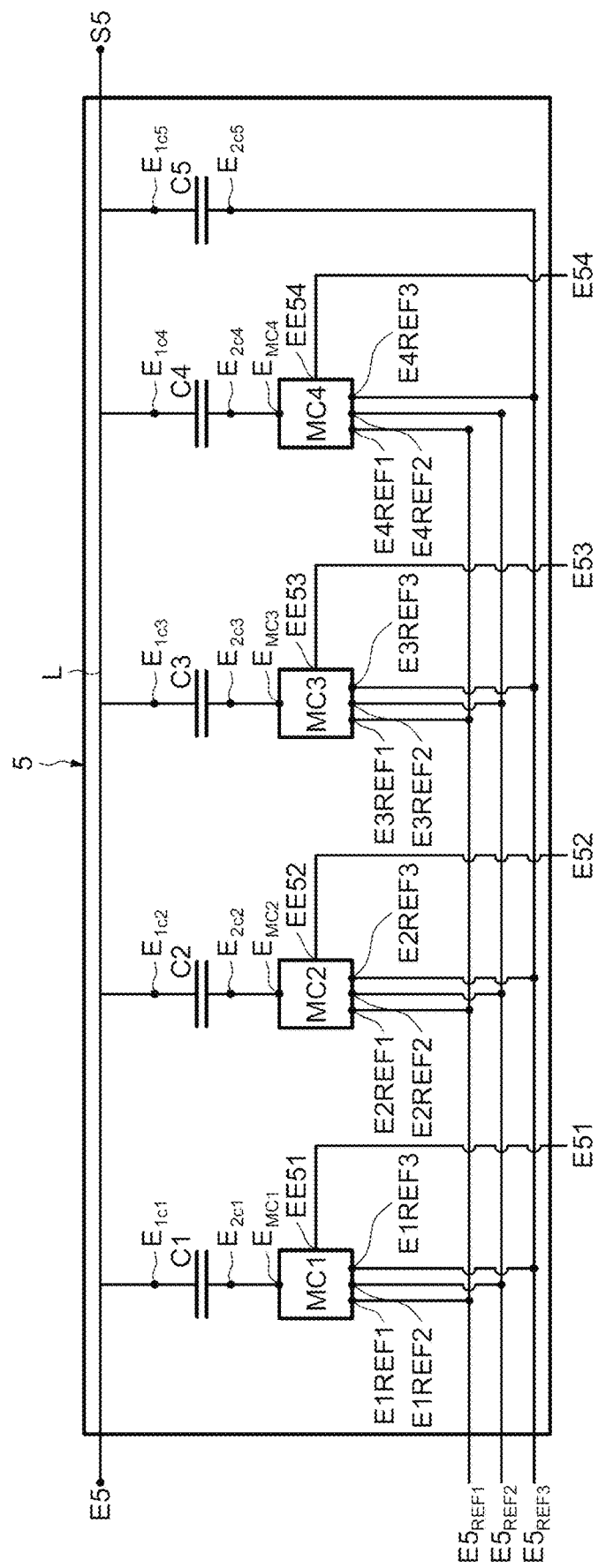
Figure 4:
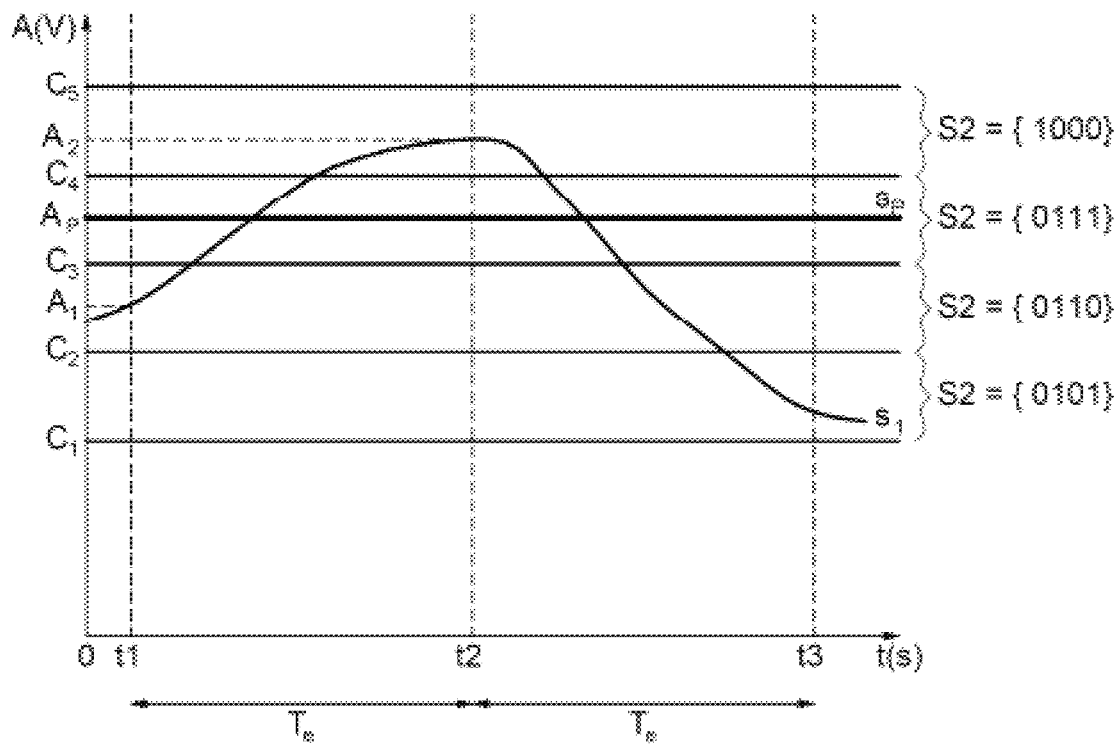
Figure 5:
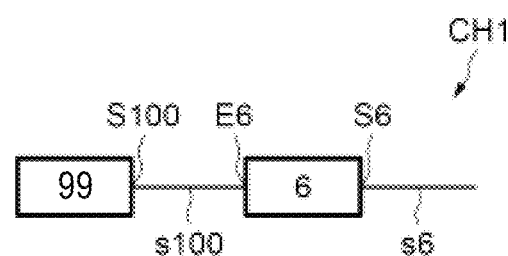
FIGS. 5 to 9 schematically illustrate embodiments and implementations of the invention.

Reference is made to FIG. 5 which represents an embodiment of an image acquisition chain CH1 of a pixel 99.

The chain CH1 includes the pixel 99 and a four-bit type charge redistribution analog-to-digital converter 6.

An output S100 of the pixel 99 is connected to an input E6 of the converter 6.

The pixel 99 includes a photodiode and switching transistors and generates at its output S100 two successive signals, the difference of which is proportional to the captured light intensity.

The two signals are successively converted by the device 6 into two distinct digital words.

In what follows, only the processing of a first analog signal s6 emitted by the pixel 99 is described in detail. The processing of a second signal emitted by the pixel 99 by the device 6 is identical to the processing of the first signal.

The analog signal s100 is converted by the device 6 into a digital word s6.

Figure 6:
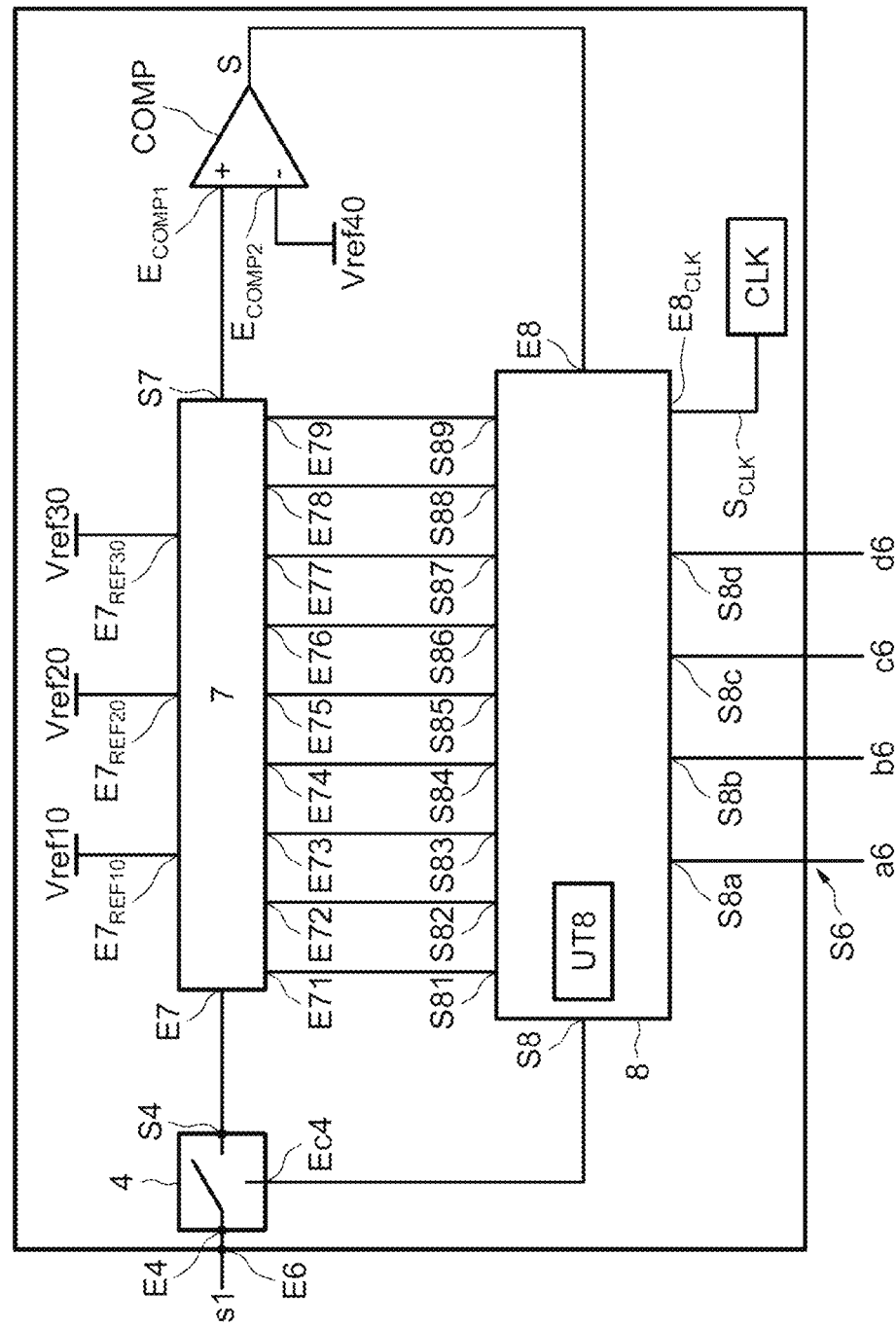

Reference is made to FIG. 6 which represents an example of a charge redistribution analog-to-digital converter of the 4-bit type 6.

The converter 6 includes the sampler 4, the clock CLK and the comparator COMP previously defined. It further includes a four-bit type charge redistribution analog-to-digital conversion device 7, and a state machine 8.

The state machine 8 is, for example, implemented from logic gates, of a microprocessor or a microcontroller.

The input E4 of the sampler 4 is connected to the input E6, the output S4 is connected to an input E7 of the device 7 and the control input Ec4 is connected to an output S8 of the state machine 8.

The device 7 includes three connection terminals connected to three reference potential sources of different values Vref10, Vref20 and Vref30 connected to the connection terminals $E7_{REF10}$, $E7_{REF20}$ and $E7_{REF30}$ respectively, and an output S7 connected to a non-inverting input $E_{COMP1}$ of the comparator COMP.

The potential Vref10 is less than the potential Vref20 and the potential Vref30 is connected to the earth.

The value of the potentials Vref10, Vref20 is selected so that the amplitude of the signal s1 varying, for example, between −1 volts and +1 volts i.e. included in the interval [Vref10; Vref20].

For example, a first reference potential source Vref10 is equal to −1 volts, a second reference potential source Vref20 of the same value as the first source Vref10 and of opposite sign i.e. +1 Volts and a third potential source Vref30 coupled to an earth.

The device 7 further includes here nine control inputs E71, E72, E73, E74, E75, E76, E77, E78 and E79, connected to nine outputs S81, S82, S83, S84, S85, S86, S87, S88 and S89 respectively of the state machine 8.

The inverting input $E_{COMP2}$ connected to a potential source Vref4o and the output S is connected to an input E8 of the state machine 8.

The potential Vref40 is connected here to the earth/ground potential.

The state machine 8 includes an input $E8_{CLK}$ connected to the clock CLK and four outputs S8a, S8b, S8c and S8d connected to the output interface S6 which here includes four outputs a6, b6, c6 and d6 respectively.

The state machine 8 further includes a programmable processing unit UT8 as represented here.

The processing unit UT8 may also be located outside the state machine 8.

Figure 7:
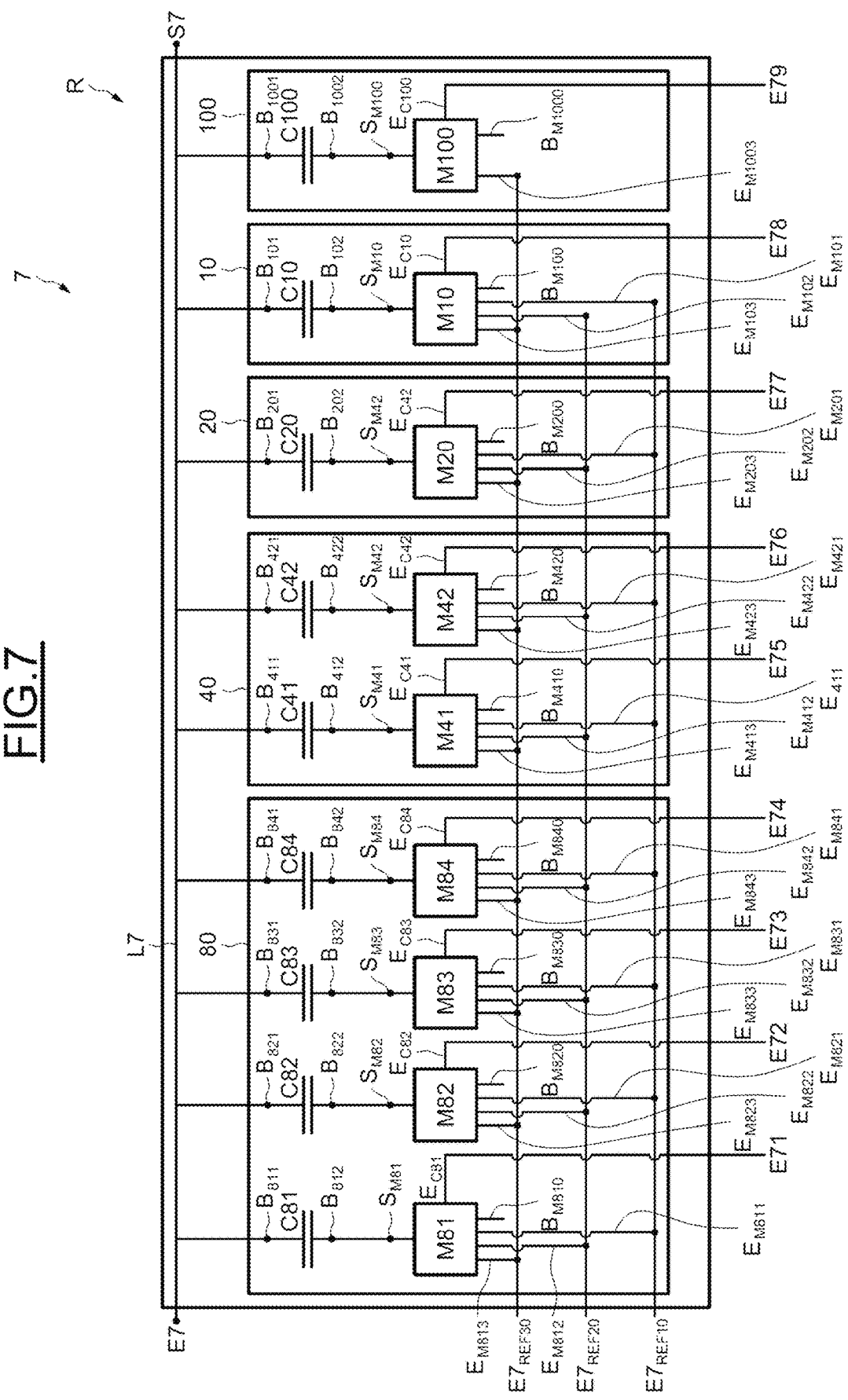

Reference is now made to FIG. 7 which represents an embodiment of a four-bit type charge redistribution analog-to-digital conversion device 7.

The converter 7 includes a line L7 connecting the input E7 to the output S7 and a network of capacitors R comprising five groups of capacitors 80, 40, 20, 10 and 100.

The groups 80, 40, 20, 10 and 100 of capacitors include four capacitors C81, C82, C83 and C84, two capacitors C41 and C42, one capacitor C20, one capacitor C10 and one capacitor C100 respectively, whereof a first terminal $B_{811}$, $B_{821}$, $B_{831}$, $B_{841}$, $B_{411}$, $B_{421}$, $B_{201}$, $B_{101}$ and $B_{1001}$ respectively is connected to the line L7 and a second terminal $B_{812}$, $B_{822}$, $B_{832}$, $B_{842}$, $B_{412}$, $B_{422}$, $B_{202}$, $B_{102}$ and $B_{1002}$ respectively is connected to an output $S_{M81}$, $S_{M82}$, $S_{M83}$, $S_{M84}$, $S_{M41}$, $S_{M42}$, $S_{M20}$, $S_{M10}$, $S_{M100}$ respectively of the switching circuit M81, M82, M83, M84, M41, M42, M20, M10 and M100 respectively.

Each switching circuit M81, M82, M83, M84, M41, M42, M20, M10 and M100 includes a control input $E_{c81}$, $E_{c82}$, $E_{c83}$, $E_{c84}$, $E_{c41}$, $E_{c42}$, $E_{c20}$, $E_{c10}$ and $E_{c100}$ respectively connected to the input E71, E72, E73, E74, E75, E76, E77, E78 and E79 respectively.

Each switching circuit M81, M82, M83, M84, M41, M42, M20, M10 further includes a first input $E_{M813}$, $E_{M823}$, $E_{M833}$, $E_{M843}$, $E_{M413}$, $E_{M423}$, $E_{M203}$, $E_{M103}$ respectively connected to the input $E7_{REF30}$, a second input $E_{M812}$, $E_{M822}$, $E_{M832}$, $E_{M842}$, $E_{M412}$, $E_{M422}$, $E_{M202}$, $E_{M102}$ respectively connected to the input $E7_{REF20}$, a third input $E_{M811}$, $E_{M821}$, $E_{M831}$, $E_{M841}$, $E_{M411}$, $E_{M421}$, $E_{M201}$, $E_{M101}$ respectively connected to the input $E7_{REF10}$.

The switching circuit M100 further includes an input $E_{M1003}$ connected to the input $E7_{REF30}$.

Each switching circuit M81, M82, M83, M84, M41, M42, M20, M10 and M100 also includes a floating terminal $B_{M810}$, $B_{M820}$, $B_{M830}$, $B_{M840}$, $B_{M410}$, $B_{M420}$, $B_{M200}$, $B_{M100}$, $B_{M1000}$ respectively which is floating.

Each switching circuit is configured for connecting its output to one of its first, second or third inputs or to its floating terminal according to the control signal received at its control input.

Each floating terminal of a switching circuit is not connected to any physical element of the converter 6 so as to conserve the accumulated charge in the associated capacitor when the second terminal of the capacitor is coupled to the floating terminal.

The network of capacitors R includes a reference capacitor which here is the capacitor C100 of capacitance CAP, e.g. 200 fF.

The capacitance of the capacitor C10 is equal to CAP, the capacitance of the capacitors C20, C41, C42, C81, C82, C83 and C84 here is equal to twice the capacitance CAP.

As the charge redistribution analog-to-digital conversion device 7 is of the four-bit type, the total capacitance of the network of capacitors R here is equal to 24 times CAP i.e. sixteen times CAP.

In other words, the network R of capacitors includes a reference capacitor C100 of a capacitance equal to a reference capacitance CAP and N groups of capacitors, here four groups 80, 40, 20 and 10, the overall capacitance of each group following a geometric progression series of ratio $$\frac{2^N}{2^n}, 1 \le n \le N$$

and of an initial value equal to the reference capacitance CAP, the capacitors of each group having a capacitance which is a multiple of the reference capacitance, the overall capacitance of the network of capacitors being equal to 2N times the reference capacitance.

In operation, the signal s1 is transmitted to the input E6.

Figure 8:
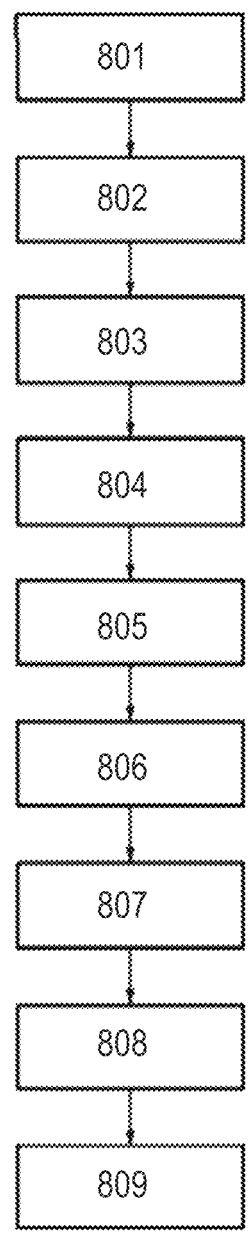
Figure 9:
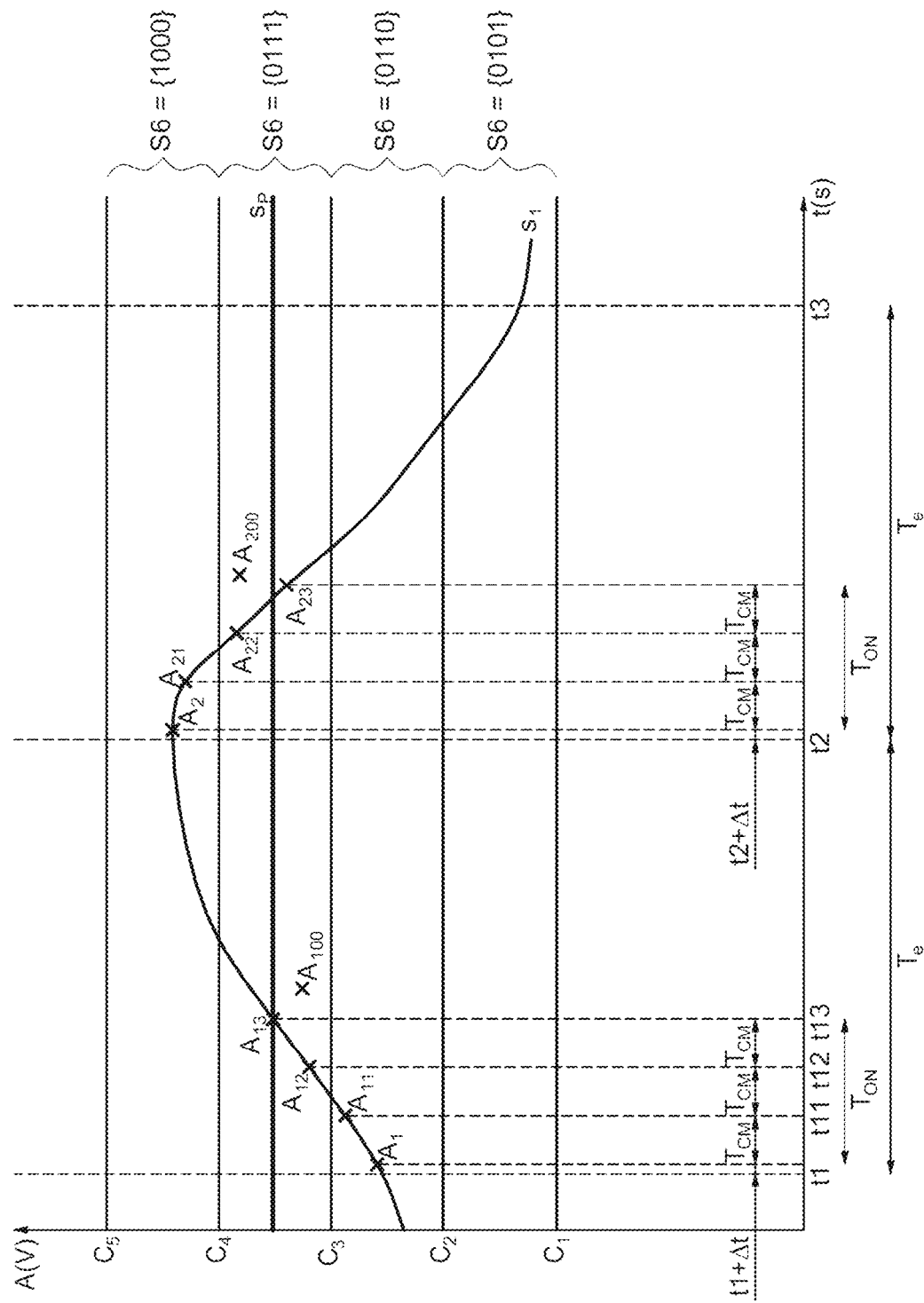

Reference is now made to FIGS. 8 and 9 which respectively depict an implementation of the converter 6, and the digital encoding obtained by implementing the converter 6 from the signals $s_1$ and $s_p$ previously defined according to time.

The sampler 4 operates at the sampling frequency Fe of period $T_e$, e.g. 1 μs. It is assumed that initially the sampler 4 is "off", i.e. that the signal $s_1$ is not transmitted to the input E7, and the second terminal of each capacitor is connected to the earth via the switching circuit.

In a first step 801 at instant t1, the sampler 4 is "on". The signal $s_1$ charges the network R of capacitors.

In a second step 802 of storing charges, at instant t1 plus Δt, the signal $s_1$ has an amplitude equal to $A_1$. The network of capacitors is charged. The second terminals $B_{812}$ and $B_{822}$ are disconnected from the earth for leaving the second terminal of each capacitor floating by connecting it to the terminal $B_{M810}$ and $B_{M820}$ respectively.

Then in step 803 of storing charges, after a duration $T_{CM}$, at instant t11, the second terminals $B_{832}$ and $B_{842}$ are disconnected from the earth for leaving the second terminal of each capacitor floating by connecting it to the terminal $B_{M820}$ and $B_{M840}$ respectively. The signal $s_1$ has an amplitude equal to $A_{11}$.

In step 804 of storing charges, after a duration $T_{CM}$, at instant t12, the second terminals $B_{412}$ and $B_{422}$ are disconnected from the earth for leaving the second terminal of each capacitor floating by connecting it to the terminal $B_{M410}$ and $B_{M420}$ respectively. The signal $s_1$ has an amplitude equal to $A_{12}$.

In step 805 of storing charges, after a duration $T_{CM}$, at instant t13, the second terminals $B_{202}$, $B_{102}$ and $B_{1002}$ are disconnected from the earth/ground potential for leaving the second terminal of each capacitor floating by connecting it to the terminal $B_{M200}$, $B_{M100}$ and $B_{M1000}$ respectively. The signal $s_1$ has an amplitude equal to $A_{13}$.

All the second terminals of the capacitors incorporated in the network of capacitors R have been successively disconnected after a predetermined duration $T_{CM}$ separating two disconnections from the earth for being floating.

Then, in step 806, when all the capacitors have been disconnected from the earth, the sampler 4 is "off".

In step 807, the second terminal of each capacitor is connected to the earth. In this step, the charge contained in each capacitor is redistributed in the network R so that each capacitor stores the same charge equal to the overall charge stored in the network R divided by the total number of capacitors in the network R. Consequently, the samples of the signal s1 stored in the network R in the preceding steps are averaged.

In step 808, the dichotomy algorithm known to the person skilled in the art is implemented on the value of amplitudes $A_{100}$ of the signal $s_1$ corresponding to the average of the amplitudes $A_1$, $A_{11}$, $A_{12}$ and $A_{13}$ recorded at instants t1, t11, t12, t13 respectively.

Then in step 809, after a duration $T_{algo}$ equal to the duration of implementation of the dichotomy algorithm, the state machine 8 determines the digital word corresponding to the value of the signal $s_1$ recorded by the sampler 4 and delivers the four-bit digital word.

The digital word is transmitted to the output interface S6 including four outputs a6, b6, c6 and d6 by the unit UT8.

The state machine 8 is configured for implementing the dichotomy algorithm used for calculating the digital word from the average by driving the switching circuit according to the output value of the comparator COMP and the signal CLK.

The output a6 corresponds to the bit known to the person skilled in the art as the "Most Significant Bit" MSB and the output d6 corresponds here to the bit known to the person skilled in the art as the "Least Significant Bit" LSB.

The resolution of the device 6 is such that the amplitude A1 is included in a quantum interval [C2; C3] corresponding here to the binary word 0110 while the amplitude Ap is included in a quantum interval [C3; C4] corresponding here to the digital word 0111.

Then the preceding steps are repeated at instant t2 corresponding to instant t1 plus the duration $T_e$.

Four samples of the signal s1 were recorded separated by a duration $T_{CM}$, then the average of these four values was calculated and finally the dichotomy algorithm was applied implemented by the converter 6 on the average value $A_{100}$.

The calculation of the average by charge redistribution in the network R makes it possible to filter the value of the signal $s_1$ that will be digitized. The filter implemented during the operation of calculating the average results from the switching order of the capacitors incorporated in the network R.

In order to improve the accuracy of calculating the average, the number of samples may be increased, here a maximum of eight samples may be obtained by switching successively and with a constant duration the capacitors C81 to 84, then C41, C42, C20 and finally C10 and C100 simultaneously.

However, the sum of the durations of switching $T_{CM}$ of each capacitor or group of capacitors and of implementing the dichotomy algorithm $T_{algo}$ must be less than the sampling frequency $T_e$.

The duration $\Delta t$ is negligible with respect to the duration $T_{CM}$, e.g. $T_{CM}$ is equal to 100 ns, $T_{algo}$ is equal to 800 ns and $\Delta t$ is equal to 4 ns.

The capacitors are switched so that the charge switched at each instant is constant. In the example previously described, the overall switched capacitance at each of instants t1, t11, t12 and t13 is equal to twice CAP.

The second terminal of capacitors is disconnected after a predetermined duration TCM so that the overall charge switched is constant.

According to another embodiment, by switching different capacitors at each instant, a weighted average value is obtained.

The person skilled in the art will know how adapt the number and the capacitance of the capacitors according to the frequency response of the analog-to-digital converter sought by increasing the number of samples used, on the one hand, for calculating the average of the amplitude of the signal on which the dichotomy algorithm is applied for determining the digital word associated with this value, and on the other hand, for adapting the analog-to-digital conversion device to a converter of the N-bit type, N being greater than two.

Although the analog-to-digital conversion device previously described implements a dichotomy algorithm for determining a digital word, the device may, according to another implementation, implement a redundant type of algorithm known to the person skilled in the art for determining a digital word. The previously described steps of storing charges in the capacitors will be adapted to the chosen redundant type of algorithm.

Furthermore, the converter 6 is configurable for optionally not using the floating terminals and connecting all the second terminals of the capacitors to the potential $E7_{REF30}$ and dispensing with calculating the average in some applications.

What is claimed is:

1. An N-bit type charge redistribution analog-to-digital conversion device, comprising:
an input terminal configured to receive an input signal;
an output terminal coupled to the input terminal via a line, wherein the output terminal is configured to be coupled to a comparator;
a plurality of reference potential terminals configured to be respectively coupled to a plurality of reference potential sources of different values;
a plurality of switching circuits; and
a network of capacitors comprising a plurality of capacitors, wherein a first terminal of each capacitor of the network of capacitors is coupled to the line, wherein a second terminal of a respective capacitor of the network of capacitors is coupled to a respective switching circuit of the plurality of switching circuits, the respective switching circuit is configured to couple the second terminal of the respective capacitor to one of the plurality of reference potential sources or to leave the second terminal of the respective capacitor floating, wherein the network of capacitors comprises a reference capacitor having a capacitance equal to a reference capacitance value and N groups of capacitors, wherein an overall capacitance n of each group of the N groups of capacitors follows a geometric progression series of ratio $$\frac{2^N}{2^n},$$

wherein N is a positive integer greater or equal to 1, and wherein n is a positive integer greater or equal to 1 and smaller or equal to N.

2. The device according to claim 1, wherein an initial value of the geometric progression series is equal to the reference capacitance value.

3. The device according to claim 1, wherein capacitors of each group of the N groups of capacitors have a capacitance being a multiple of the reference capacitance value, and wherein an overall capacitance of the network of capacitors is equal to 2N times the reference capacitance value.

4. The device according to claim 1, wherein N is equal to 4, wherein a first group of capacitors of the N groups of capacitors comprises four capacitors having a capacitance equal to twice the reference capacitance value, wherein a second group of capacitors of the N groups of capacitors comprises two capacitors having a capacitance equal to twice the reference capacitance value, wherein a third group of capacitors of the N groups of capacitors comprises one capacitor having a capacitance equal to twice the reference capacitance value, and wherein a fourth group of capacitors of the N groups of capacitors comprises one capacitor having a capacitance equal to the reference capacitance value.

5. The device according to claim 1, wherein the plurality of reference potential sources comprises a first reference potential source and a second reference potential source having a same magnitude and an opposite sign.

6. The device according to claim 5, wherein the plurality of reference potential sources further comprises a third reference potential source coupled to a ground potential.

7. An analog-to-digital converter, comprising:
a conversion device, comprising:
an input terminal configured to receive an input signal;
an output terminal coupled to the input terminal via a line;
a plurality of reference potential terminals configured to be respectively coupled to a plurality of reference potential sources of different values;
a plurality of switching circuits; and
a network of capacitors comprising a plurality of capacitors, wherein a first terminal of each capacitor of the network of capacitors is coupled to the line, wherein a second terminal of a respective capacitor of the network of capacitors is coupled to a respective switching circuit of the plurality of switching circuits, the respective switching circuit is configured to couple the second terminal of the respective capacitor to one of the plurality of reference potential sources or to couple the second terminal of the respective capacitor to a floating terminal;
a comparator coupled to the output terminal of the conversion device; and
a state machine configured to successively connect the second terminal of the plurality of capacitors to the floating terminal.

8. The analog-to-digital converter according to claim 7, wherein the output terminal of the conversion device is coupled to a non-inverting input of the comparator, and wherein an inverting input of the comparator is coupled to a variable potential different from the plurality of reference potential sources, and wherein an output of the comparator is coupled to an input of the state machine.

9. The analog-to-digital converter according to claim 7, wherein the state machine comprises a plurality of outputs for delivering a digital word, and wherein respective inputs of the plurality of switching circuits are coupled to respective outputs of the plurality of outputs of the state machine.

10. The analog-to-digital converter according to claim 7, wherein the output terminal is directly connected to the input terminal via the line.

11. The analog-to-digital converter according to claim 7, wherein the network of capacitors comprises a reference capacitor having a capacitance equal to a reference capacitance value and N groups of capacitors, wherein an overall capacitance n of each group of the N groups of capacitors follows a geometric progression series of ratio $$\frac{2^N}{2^n},$$

wherein N is a positive integer greater or equal to 1, and wherein n is a positive integer greater or equal to 1 and smaller or equal to N.

12. An image acquisition chain, comprising:
a pixel; and
a conversion device comprising an input terminal coupled to an output of the pixel, the conversion device comprising:
an output terminal coupled to the input terminal via a line;
a plurality of reference potential terminals configured to be respectively coupled to a plurality of reference potential sources of different values;
a plurality of switching circuits; and
a network of capacitors comprising a plurality of capacitors, wherein a first terminal of each capacitor of the network of capacitors is coupled to the line, wherein a second terminal of a respective capacitor of the network of capacitors is coupled to a respective switching circuit of the plurality of switching circuits, the respective switching circuit is configured to couple the second terminal of the respective capacitor to one of the plurality of reference potential sources or to couple the second terminal of the respective capacitor to a floating terminal, wherein the network of capacitors comprises a reference capacitor having a capacitance equal to a reference capacitance value and N groups of capacitors, wherein an overall capacitance n of each group of the N groups of capacitors follows a geometric progression series of ratio $$\frac{2^N}{2^n},$$

wherein N is a positive integer greater or equal to 1, and wherein n is a positive integer greater or equal to 1 and smaller or equal to N.

13. The image acquisition chain according to claim 12, wherein an initial value of the geometric progression series is equal to the reference capacitance value.

14. The image acquisition chain according to claim 12, wherein capacitors of each group of the N groups of capacitors have a capacitance being a multiple of the reference capacitance value, and wherein an overall capacitance of the network of capacitors is equal to 2N times the reference capacitance value.

15. The image acquisition chain according to claim 12, wherein N is equal to 4, wherein a first group of capacitors of the N groups of capacitors comprises four capacitors having a capacitance equal to twice the reference capacitance value, wherein a second group of capacitors of the N groups of capacitors comprises two capacitors having a capacitance equal to twice the reference capacitance value, wherein a third group of capacitors of the N groups of capacitors comprises one capacitor having a capacitance equal to twice the reference capacitance value, and wherein a fourth group of capacitors of the N groups of capacitors comprises one capacitor having a capacitance equal to the reference capacitance value.

16. An image acquisition chain, comprising:
a pixel; and
a conversion device comprising an input terminal coupled to an output of the pixel, the conversion device comprising:
an output terminal coupled to the input terminal via a line;
a plurality of reference potential terminals configured to be respectively coupled to a plurality of reference potential sources of different values;
a plurality of switching circuits;
a network of capacitors comprising a plurality of capacitors, wherein a first terminal of each capacitor of the network of capacitors is coupled to the line, wherein a second terminal of a respective capacitor of the network of capacitors is coupled to a respective switching circuit of the plurality of switching circuits, the respective switching circuit is configured to couple the second terminal of the respective capacitor to one of the plurality of reference potential sources or to couple the second terminal of the respective capacitor to a floating terminal; and
a state machine configured to successively connect the second terminal of the plurality of capacitors to the floating terminal.

17. A method, comprising:
receiving an input signal at an input terminal of an N-bit type charge redistribution analog-to-digital conversion device;
asserting an output signal at an output terminal of the N-bit type charge redistribution analog-to-digital conversion device, wherein the output terminal is coupled to the input terminal via a line and to a comparator;
providing a plurality of reference potentials of different values to a plurality of reference potential terminals of the N-bit type charge redistribution analog-to-digital conversion device;
switching a network of capacitors, comprising a plurality of capacitors, using a plurality of switching circuits, wherein a first terminal of each capacitor of the network of capacitors is coupled to the line, wherein a second terminal of a respective capacitor of the network of capacitors is coupled to a same reference potential of the plurality of reference potentials, wherein switching the network of capacitors comprises:
disconnecting the second terminal of the respective capacitor from a ground potential to leave the second terminal of the respective capacitor floating when the network of capacitors is charged by the input signal; and repeating disconnection of the second terminal of successive capacitors of the network of capacitors after a predetermined duration until the second terminal of each capacitor of the network of capacitors is floating.

18. The method according to claim 17, wherein the second terminal of each capacitor of the network of capacitors is disconnected from the ground potential after the predetermined duration so that an overall switched capacitance is constant.

19. The method according to claim 17, wherein the plurality of reference potentials comprises a first reference potential source and a second reference potential source having a same magnitude and an opposite sign.

20. The method according to claim 19, wherein the same reference potential of the plurality of reference potentials is coupled to the ground potential.

\* \* \* \* \*